US009423970B2

(12) United States Patent
Darragh

(10) Patent No.: US 9,423,970 B2
(45) Date of Patent: Aug. 23, 2016

(54) METHOD AND SYSTEM FOR PREDICTING BLOCK FAILURE IN A NON-VOLATILE MEMORY

(71) Applicant: SanDisk Technologies Inc., Plano, TX (US)

(72) Inventor: Neil Richard Darragh, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 247 days.

(21) Appl. No.: 14/144,195

(22) Filed: Dec. 30, 2013

(65) Prior Publication Data

US 2015/0186055 A1 Jul. 2, 2015

(51) Int. Cl.
| | | |
|---|---|---|
| *G11C 16/04* | (2006.01) | |
| *G06F 3/06* | (2006.01) | |
| *G11C 16/34* | (2006.01) | |
| *G06F 12/02* | (2006.01) | |
| *G11C 29/02* | (2006.01) | |
| *G11C 16/16* | (2006.01) | |
| *G11C 29/50* | (2006.01) | |
| *G11C 29/04* | (2006.01) | |

(52) U.S. Cl.
CPC ........... *G06F 3/0616* (2013.01); *G06F 3/0653* (2013.01); *G06F 3/0679* (2013.01); *G06F 12/0246* (2013.01); *G11C 16/349* (2013.01); *G11C 16/3445* (2013.01); *G11C 29/028* (2013.01); *G06F 2212/7211* (2013.01); *G11C 16/16* (2013.01); *G11C 29/50004* (2013.01); *G11C 2029/0409* (2013.01)

(58) Field of Classification Search
CPC . G11C 16/349; G11C 11/5635; G11C 29/50; G11C 16/344; G11C 16/3445
See application file for complete search history.

(56) References Cited

U.S. PATENT DOCUMENTS

| | | | |
|---|---|---|---|
| 5,844,841 A | 12/1998 | Takeuchi et al. | |
| 2002/0031026 A1 | 3/2002 | Kobayashi | |
| 2005/0041515 A1* | 2/2005 | Futatsuyama | G11C 16/16 365/232 |
| 2009/1382875 | 5/2009 | Kitahara et al. | |
| 2010/0037001 A1 | 2/2010 | Langlois et al. | |
| 2012/0239858 A1 | 9/2012 | Melik-Martirosian | |
| 2013/0155773 A1* | 6/2013 | Miyamoto | G11C 16/06 365/185.12 |
| 2014/0019675 A1 | 1/2014 | Oh et al. | |
| 2015/0117107 A1* | 4/2015 | Sun | G11C 16/10 365/232 |

OTHER PUBLICATIONS

U.S. Appl. No. 14/144,202, filed Dec. 30, 2013 (46 pages).
International Search Report and Written Opinion in International Application No. PCT/US214/070759 dated Mar. 20, 2015.
Notice of Allowance for U.S. Appl. No. 14/144,202 mailed Dec. 17, 2015.

* cited by examiner

*Primary Examiner* — Tuan T Nguyen
(74) *Attorney, Agent, or Firm* — Brinks Gilson & Lione

(57) ABSTRACT

A method and system are disclosed for improved block erase cycle life prediction and block management in a non-volatile memory. The method includes the storage device tracking information relating to a first erase cycle count at which the block erase time exceeded a predetermined threshold relative to a first erase cycle at which this occurred in other blocks. Blocks having a later relative erase cycle at which the erase time threshold is exceeded are assumed to have a greater erase cycle life than those that need to exceed the erase time threshold at an earlier erase cycle. This information is used to adjust wear leveling in the form of free block selection, garbage collection block selection and other block management processes. Alternatively or in combination, the predicted erase cycle life information is used to adjust program and/or erase parameters such as erase voltage and time.

22 Claims, 11 Drawing Sheets

METHOD AND SYSTEM FOR PREDICTING BLOCK FAILURE IN A NON-VOLATILE MEMORY

TECHNICAL FIELD

This application relates generally to a method and system for predicting relative memory block life in a non-volatile memory.

BACKGROUND

Non-volatile memory systems, such as flash memory, are used in digital computing systems as a means to store data and have been widely adopted for use in consumer products. Flash memory may be found in different forms, for example in the form of a portable memory card that can be carried between host devices or as a solid state disk (SSD) embedded in a host device. These memory systems typically work with data units called "pages" that can be written, and groups of pages called "blocks" that can be read and erased, by a storage manager often residing in the memory system.

Flash storage systems generally fail when they run out of spare blocks to replace blocks that have been retired because they failed to erase. Blocks in a typical storage system tend not to fail at the same time. Rather, blocks often fail at different program/erase cycle levels depending on varying local fabrication parameters across a memory die and/or from die to die in a multi-die memory. FIG. 1 shows one hypothetical example of the frequency of erase failure as a function of cycle count. As is seen in this hypothetical example, the erase cycle at which the blocks fail varies by approximately 900 cycles (approximately 25%) between the earliest and latest failure.

A standard approach to try and extend the life of a storage system is to apply wear leveling based on keeping the number of program/erase cycles applied to each block as even as possible. Although this may avoid problems with concentrating program/erase cycles on only a few blocks, it is based on the assumption that blocks have the same lifespan (in terms of having the same number of program/erase cycles before failure) and may result in a storage system that fails based on the weakest blocks and wastes blocks with more remaining life for a storage system that has a failure distribution such as shown in FIG. 1

FIG. 2 illustrates a hypothetical example of how the block failure distribution such as in FIG. 1 may translate to an end of life scenario for a storage system that uses standard hot count wear leveling. A typical low-cost flash storage system may only have a few spare blocks available and, once the number of spares available has been consumed due to eventual failure of some of the blocks, the storage system itself can no longer accept data (i.e., fails) and becomes a read-only device. In FIG. 2, it is assumed that the number of spare blocks is 6 and the hypothetical failure distribution shows an example failure of the system at 3100 cycles because six blocks have failed by 3100 cycles. The remaining blocks in the storage system may have a considerable amount of erase cycle life left in them; in this example the average being perhaps 3500 cycles and some as good as 3900 cycles. However, this erase cycle life in the remaining good blocks is wasted because of the worst few blocks that failed first in this hot-count based wear leveling system.

BRIEF SUMMARY

In order to address the problems and challenges noted above, a system and method for providing and utilizing an improved prediction of block failure is disclosed.

According to a first aspect, a method is disclosed where, in a memory device having a non-volatile memory comprising a plurality of blocks of non-volatile memory cells, each of the plurality of blocks comprising a plurality of the non-volatile memory cells, and a controller in communication with the plurality of blocks. The controller is configured to monitor a time necessary to erase each of the plurality of blocks and identify a time when the time necessary to erase for a block first exceeds a predetermined threshold. The controller stores an indicator for each of the plurality of blocks identified as exceeding the predetermined threshold time. In different aspects, the relative erase count at which each of the blocks transitions to requiring more than the predetermined threshold time to erase may be used as an erase cycle life predictor and applied in block management decisions such as free block selection and selection of garbage collection blocks. In different embodiments, the controller may use the indicator for each of the blocks in a process of selecting free blocks or blocks to use in a garbage collection process.

According to another aspect, a storage device is disclosed having a non-volatile memory with a plurality of memory blocks and a controller in communication with the non-volatile memory and configured to determine a erase cycle life prediction based on the relative erase counts at which one or more erase time thresholds are first exceeded as set forth above. The erase cycle life prediction may be applied to improving overall storage device life by shifting greater wear burden to blocks predicted to have greater erase cycle life and reducing wear burden on to blocks predicted to have relatively less erase cycle life.

In another aspect a storage device is disclosed having a plurality of blocks of non-volatile memory cells, each of the plurality of blocks comprising a plurality of the non-volatile memory cells, where each of a plurality of separate memory die contain a respective portion of the plurality of blocks. The storage device includes a plurality of secondary controllers each exclusively associated with a respective one of the plurality of separate memory die and each configured to manage write and erase operations in the respective portion of the plurality of blocks in the separate memory die. A primary controller is in communication with the plurality of secondary controllers. The secondary controllers are each configured to, for each of the respective portion of the plurality of blocks associated with their respective memory die, monitor a time necessary to erase a block, identify a first time when a time necessary to erase the block takes longer than a predetermined threshold, and store an indicator for each block in the respective portion of the plurality of blocks identified as taking longer than the predetermined threshold to erase.

Other embodiments are disclosed, and each of the embodiments can be used alone or together in combination. The embodiments will now be described with reference to the attached drawings.

DETAILED DESCRIPTION

A method and system for predicting which blocks in a non-volatile memory are going to fail first, and application of that knowledge to improved management of those memory blocks, are disclosed herein. In one embodiment, a metric on which the prediction of block erase cycle life is based is the erase cycle count at which point a block first exceeds a threshold amount of time to successfully erase. One or more threshold erase times may be tracked for each block as described in greater detail below.

Figure 3:
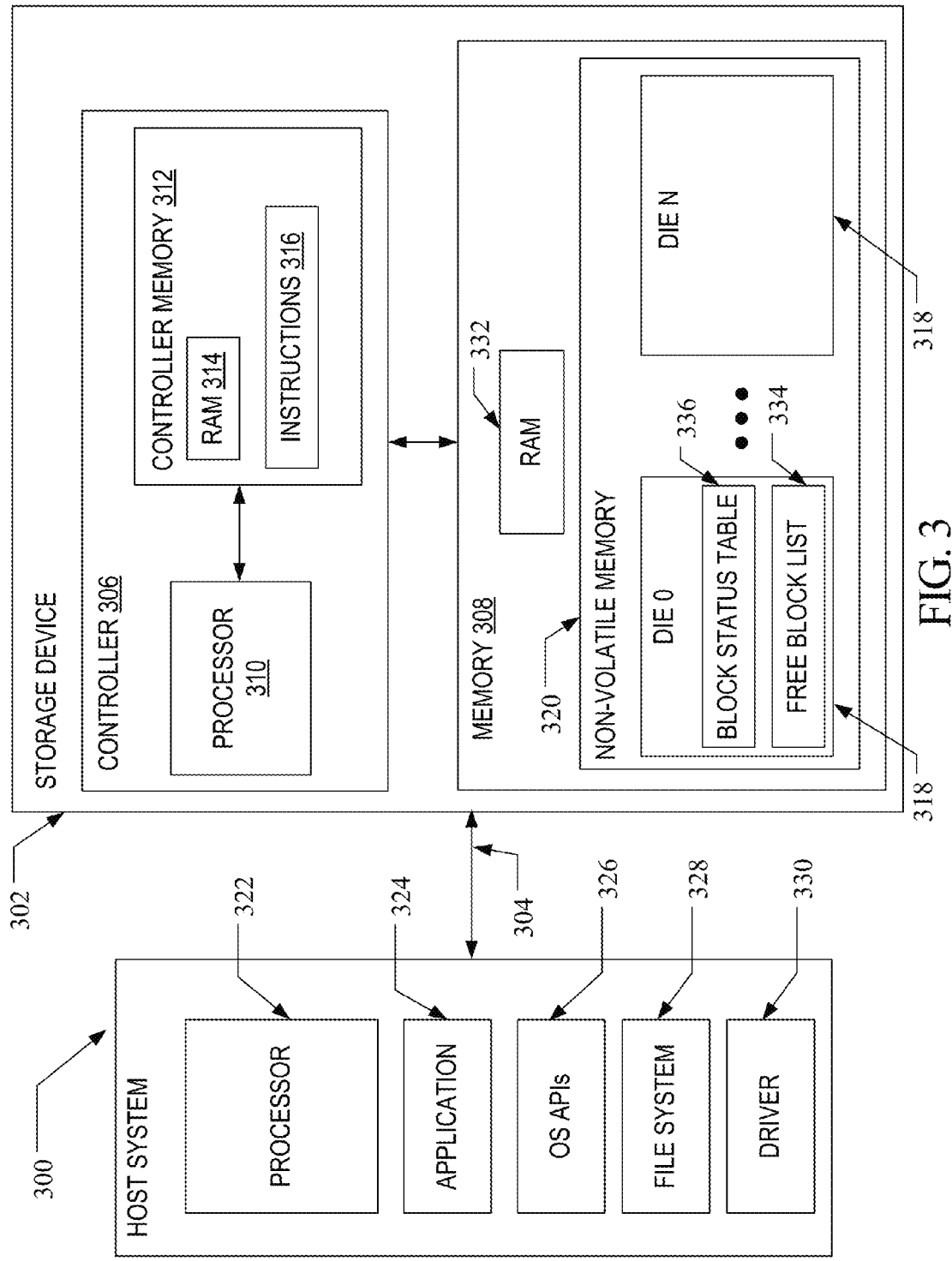
FIG. 3 illustrates an example storage device and host according to one embodiment.

A non-volatile memory system suitable for use in implementing aspects of the invention is shown in FIG. 3. A host system 300 stores data into, and retrieves data from, a storage device 302. The storage device 302 may be embedded in the host system 300 or may exist in the form of a card or other removable drive, such as a solid state disk (SSD) that is removably connected to the host system 300 through a mechanical and electrical connector. The host system 300 may be any of a number of fixed or portable data generating devices, such as a personal computer, a mobile telephone, a personal digital assistant (PDA), or the like. The host system 300 communicates with the storage device over a communication channel 304.

Figure 1:
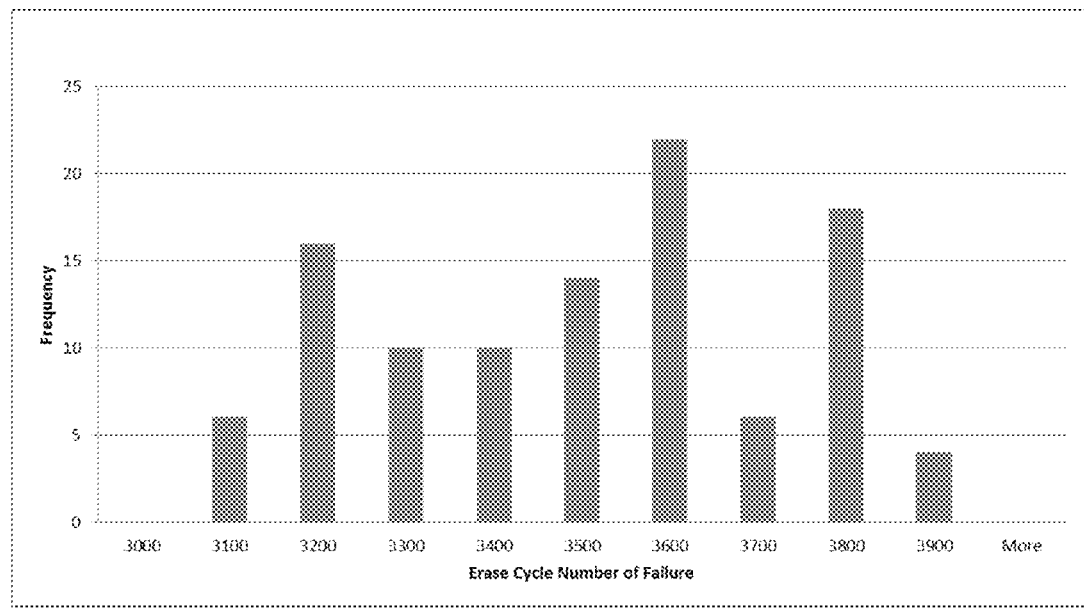
FIG. 1 illustrates a hypothetical erase cycle failure distribution for blocks in a non-volatile storage device.
Figure 2:
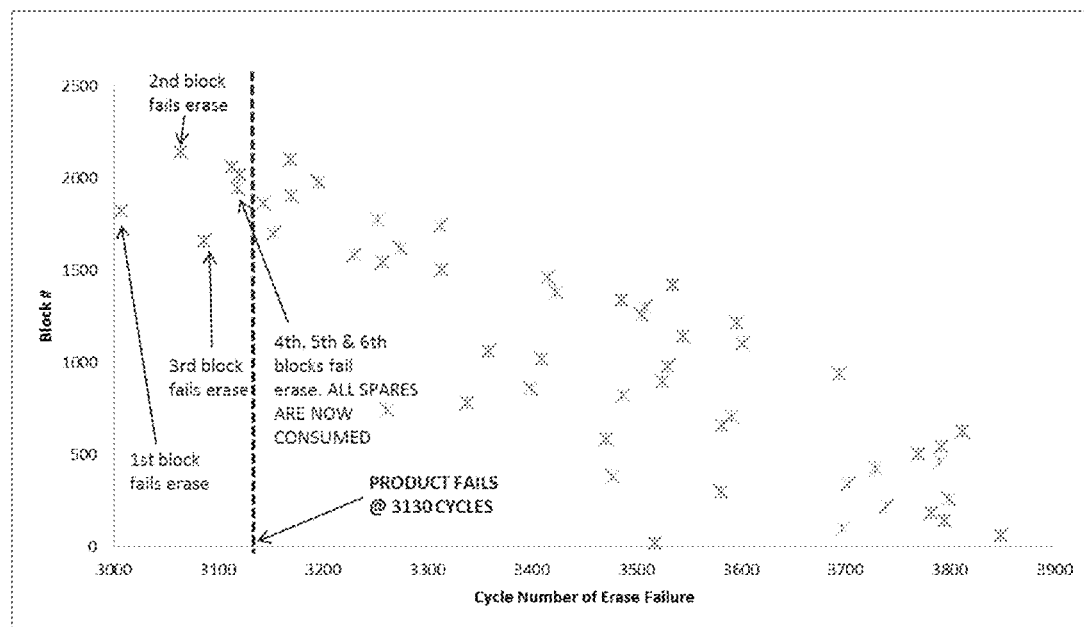
FIG. 2 illustrates a possible end of life scenario for a storage device having an erase cycle failure distribution such as illustrated in FIG. 1.

The storage device 302 contains a controller 306 and a memory 308. As shown in FIG. 1, the controller 306 includes a processor 310 and a controller memory 312. The processor 310 may comprise a microprocessor, a microcontroller, an application specific integrated circuit (ASIC), a field programmable gate array, a logical digital circuit, or other now known or later developed logical processing capability. The controller memory 312 may include volatile memory such as random access memory (RAM) 314 and/or non-volatile memory, and processor executable instructions 316 for handling memory management. The RAM 314 may include one or more of any of a number of types of RAM, such as static RAM (SRAM) or dynamic RAM (DRAM). As discussed in more detail below, the storage device 302 may include functions for memory management and block management. In operation, the processor 310 may execute memory management instructions (which may be resident in instructions 316) for block failure prediction and associated memory management functions described herein. The memory management functions may control the selection or program/erase processing of the one or more blocks of the memory 308 within storage device 302.

The memory 308 may include non-volatile memory 320 (such as NAND flash memory) on one or more separate memory die 318. One or more memory types may be included in memory 308. The memory may include cache storage (also referred to as binary cache) and main memory (also referred to as long term memory) divided into separate die 318 or sharing a same die. In embodiments where the memory 308 includes flash memory as non-volatile memory, each die 318 may be made up of the same type of flash memory cell or different types of flash memory cells. For example, the cache storage may be configured in a die 318 in a single level cell (SLC) type of flash configuration having a one bit per cell capacity while the long term storage may consist of a multi-level cell (MLC) type flash memory configuration having two or more bit per cell capacity to take advantage of the higher write speed of SLC flash and the higher density of MLC flash. Different combinations of flash memory types are also contemplated for the memory die. Additionally, the memory 308 may also include volatile memory such as any of a number of forms of random access memory (RAM) 332.

The die 318 in memory 308 may include physical blocks of flash memory that each consists of a group of pages, where a block is a group of pages and a page is a smallest unit of writing in the memory. The physical blocks in the memory include operative blocks that are represented as logical blocks to the file system 328. The storage device 302 may be in the form of a portable flash drive, an integrated solid state drive or any of a number of known flash drive formats, or any storage system that exhibits a wear mechanism when erasing or programming data. In yet other embodiments, the storage device 302 may include only a single type of flash memory having one or more partitions.

The host 300 may include a processor 322 that runs one or more application programs 324. The application programs 324, when data is to be stored on or retrieved from the storage device 302, communicate through one or more operating system application programming interfaces (APIs) 326 with the file system 328. The file system 328 may be a software module executed on the processor 322 and manages the files in the storage device 302. The file system 328 manages clusters of data in logical address space. Common operations executed by a file system 328 include operations to create, open, write (store) data, read (retrieve) data, seek a specific location in a file, move, copy, and delete files. The file system 328 may be circuitry, software, or a combination of circuitry and software.

Accordingly, the file system 328 may be a stand-alone chip or software executable by the processor of the host 300. A storage device driver 330 on the host 300 translates instructions from the file system 328 for transmission over a communication channel 304 between the host 300 and storage device 302. The interface for communicating over the communication channel 304 may be any of a number of known interfaces, such as SD, MMC, USB storage device, SATA and SCSI interfaces. A file system data structure, such as a file allocation table (FAT), may be stored in the memory 308 of the storage device 302. The host 300 utilizes the file system data structure to maintain a logical address range for all logical block addresses (LBAs) that have been assigned by the host 300 to data. The file system data structure may be located in the non-volatile memory 320 or in another memory location on the storage device 302.

In addition to the user data and host-generated file system data structures that may be stored in flash memory on the storage device 302, the controller of the storage device itself stores and maintains a logical-to-physical mapping table or other data structure that tracks the logical addresses supplied by the host file system and the physical addresses where the storage device is keeping the data. The controller may keep a separate list 334 of free blocks (fully erased or unwritten blocks) in any of the available types of memory in the controller 306 or storage device generally 302. Similarly, the controller may keep a list, or determine from a mapping table, how much valid and/or obsolete data there is in programmed blocks in the non-volatile memory. A block status table 336 containing block-specific data including program/erase parameters may be maintained in the memory 320. Although shown as residing in the first non-volatile memory die 318 (DIE 0), the free block list 334, block status table 336 and other data structures may be spread out over multiple die 318 or may be individually stored on different die in other embodiments.

Figure 4:
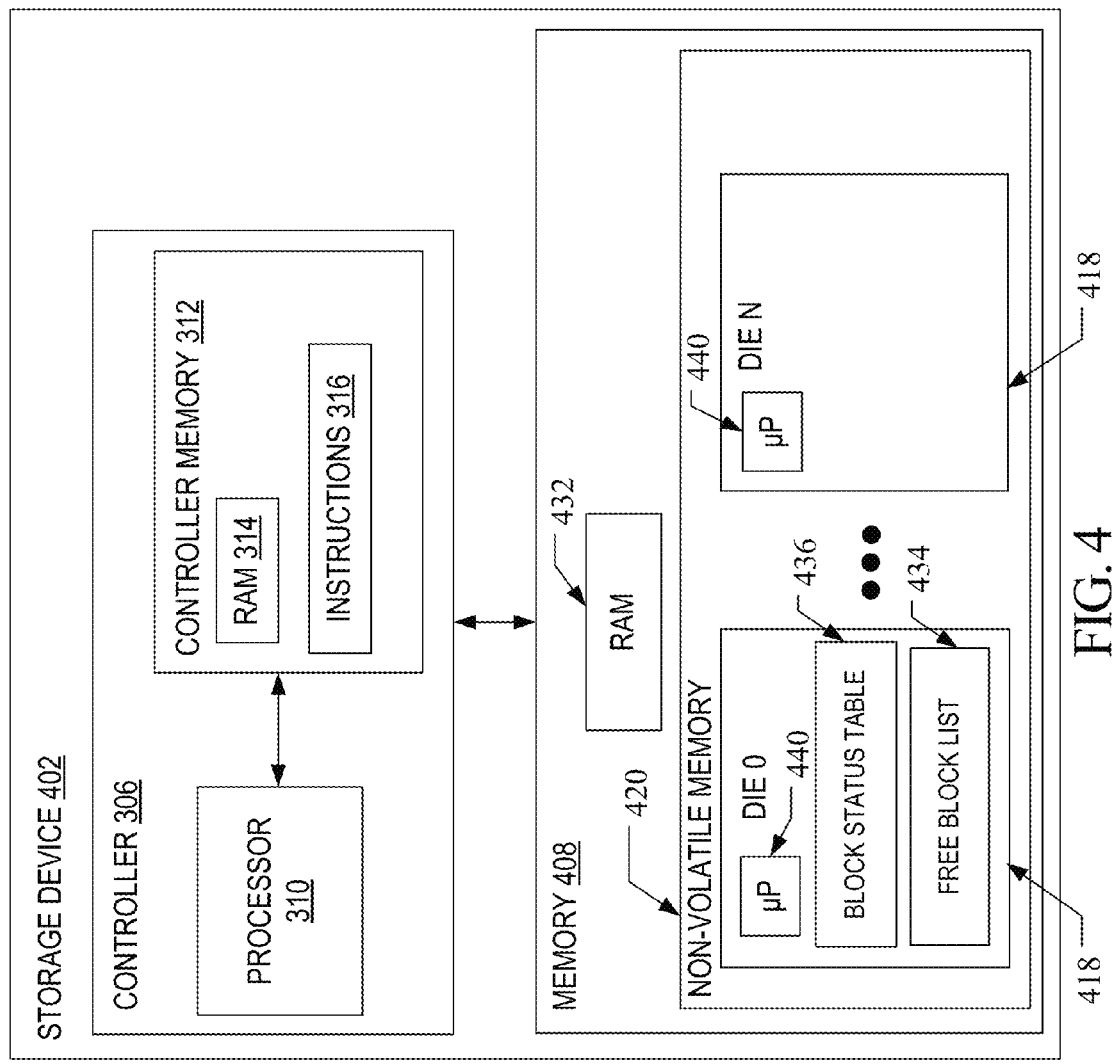
FIG. 4 illustrates an alternate embodiment of the storage device of FIG. 3.

In an alternative embodiment, such as illustrated in FIG. 4, the storage device 402 may include a non-volatile memory 420 having multiple die 418, each with a built-in processor 440. The built-in processor 440 may be the same as, or a simplified version of, the processor 310 in the main memory controller 306. In this embodiment, some of the processing burden or responsibility may be distributed between the processor 310 in the controller 306 and the respective processors 440 in one or more of the die 418. In addition to user data, the memory 408 of FIG. 4 may include the same data structures as in FIG. 3, such as a file system data structure, free block list 434, block status table 436 and other data structures in non-volatile memory 420 and/or RAM 432. The methods and techniques described below may be implemented on the storage devices 302, 402 of either FIG. 3 or 4, or on non-volatile storage devices of yet other configurations.

Figure 5:
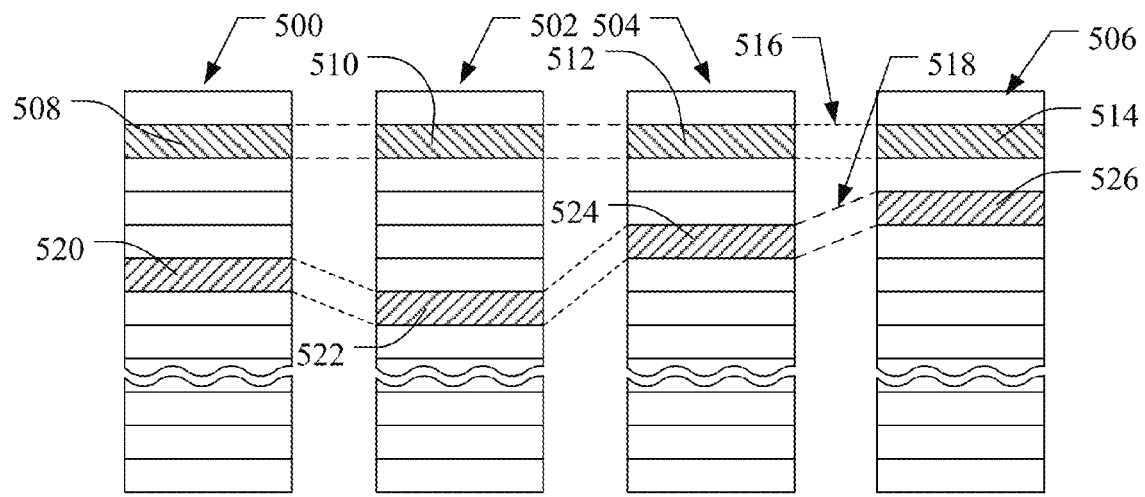
FIG. 5 illustrates a physical memory organization of the non-volatile memory in the storage device of FIG. 1.

Referring to FIG. 5, the non-volatile memory die 318 (e.g. SLC and/or MLC flash memory) may be arranged in blocks of memory cells. In the example of FIG. 5, four planes or sub-arrays 500, 502, 504 and 506 memory cells are shown that may be on a single integrated memory cell chip, on two chips (two of the planes on each chip) or on four separate chips. Other numbers of planes may exist in a system. The planes are individually divided into blocks of memory cells shown in FIG. 5 by rectangles, such as blocks 508, 510, 512 and 514, located in respective planes 500, 502, 504 and 506. There may be dozens or hundreds of blocks in each plane.

Blocks may be logically linked together to form a metablock that may be erased as a single unit. For example, blocks 508, 510, 512 and 514 may form a first metablock 516. The blocks used to form a metablock need not be restricted to the same relative locations within their respective planes, as is shown in the second metablock 518 made up of blocks 520, 522, 524 and 526.

Figure 6:
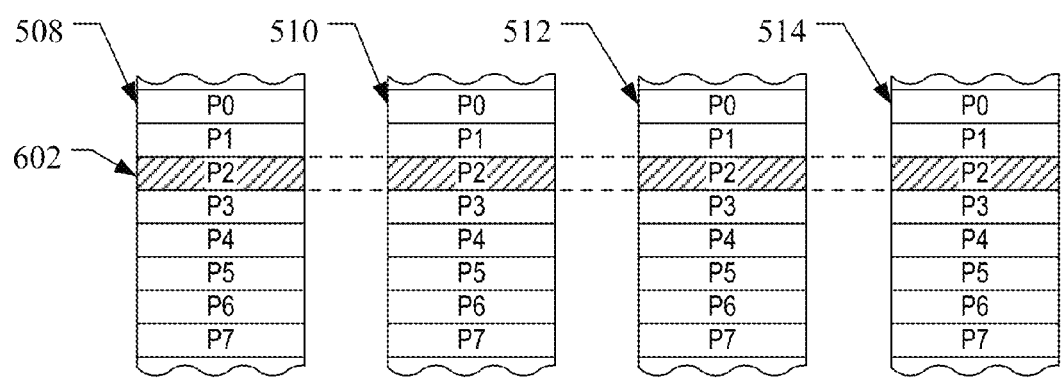
FIG. 6 shows an expanded view of a portion of the physical memory of FIG. 5.

The individual blocks are in turn divided for operational purposes into pages of memory cells, as illustrated in FIG. 6. The memory cells of each of blocks 508, 510, 512 and 514, for example, are each divided into eight pages P0-P7. Alternately, there may be 16, 32 or more pages of memory cells within each block. A page is the unit of data programming and reading within a block, containing the minimum amount of data that are programmed or read at one time. A metapage 602 is illustrated in FIG. 6 as formed of one physical page for each of the four blocks 508, 510, 512 and 514. The metapage 602 includes the page P2 in each of the four blocks but the pages of a metapage need not necessarily have the same relative position within each of the blocks. A metapage is the maximum unit of programming. The blocks disclosed in FIGS. 5-6 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host 300. The LBAs are then mapped to one or more physical blocks in the storage device 302 where the data is physically stored.

In order to address the problem of variations in total program/erase cycle life of different blocks in storage devices such as described above, a calculation of the likelihood of block erasure failure of a block relative to other blocks in the non-volatile memory is performed. When a block is erased, for example in NAND flash memory, an erase voltage having a predetermined field strength is typically applied to all cells in the block. This erase voltage is applied for a predetermined period of time and then the block state is measured to verify that the erase has been completed. When a block is relatively fresh and has been through relatively few program/erase cycles, only one application of the erase voltage for the predetermined time is generally enough to complete the erase of the block. Each repetition of the process of applying the erase voltage for a predetermined time and then measuring to verify the status of the block is referred to herein as an erase loop and each erase loop may take a same fixed amount of time.

Figure 7:
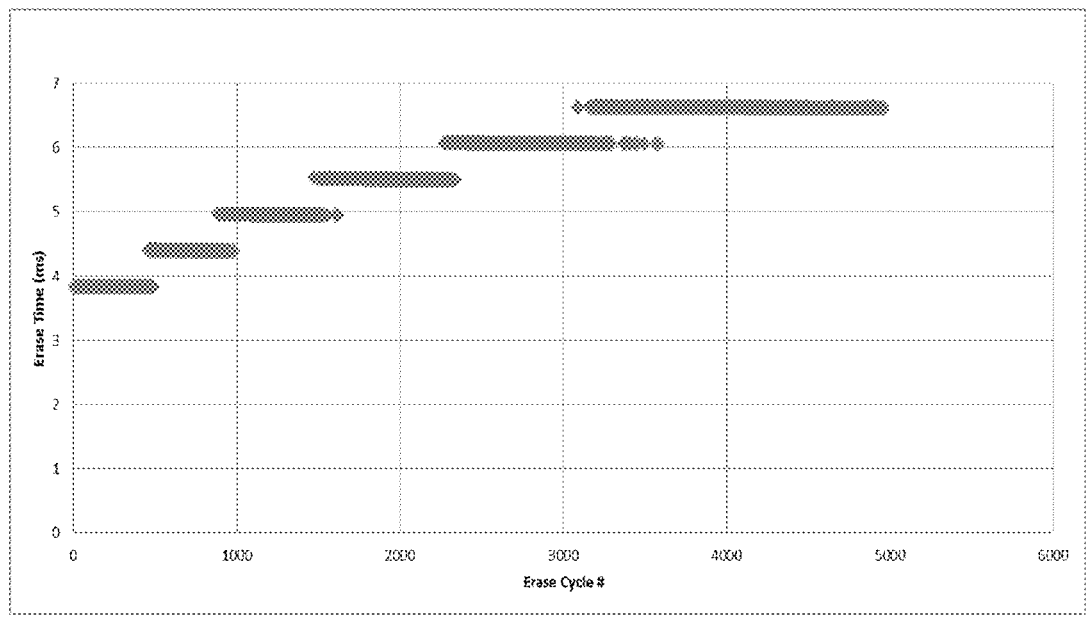
FIG. 7 is a graph showing a possible pattern of erase time increase as a function of total erase cycles in a block of a non-volatile memory.

Over time, as blocks begin to wear after a number of program/erase cycles, the blocks may need to go through more than one erase loop before the block is fully erased. When a block needs more than a predetermined number of erase cycles applied to fully erase the block, it is considered to have failed the erase process and is taken out of the available block pool as a failed block (also referred to as a bad block). FIG. 7 shows the hypothetical erase times for one flash memory block in a flash memory as it is cycled. One can see that the erase time increases in discrete steps at each of a number of different erase cycles. This is due to the generally fixed time for execution of each erase loop, where the system checks the erase state of the block after application of an erase voltage, and the execution of another erase loop until the erase criteria is met (up to some predetermined maximum allowed number of loops) as noted above. As the blocks age they tend to need more erase loops to complete an erase. The number of discrete erase loops used for any particular erase can be detected in the total erase times as illustrated in FIG. 7. The non-volatile memory 320, 420, for example via the micro-controller or microprocessor 440 in the non-volatile memory may report the failure to the memory controller 306, when the predetermined maximum limit of erase loops is reached without having achieved the desired erase state. The required erase state voltage may be any of a number of voltages that are recognized internally by the non-volatile memory as an erased voltage state. For example, in a non-volatile memory comprising NAND flash memory, an erase state may be reached when the cells in a wordline (WL) reach a predetermined voltage. A certain number of cells on a WL may be allowed not to reach the erase state and the block in which those cells reside may still be considered erased in some embodiments (i.e. the requirement inside the device is not necessarily perfection and some defects may be allowed), as the erase state may be satisfied if the cells in a block are within a predefined range of what the non-volatile memory considers erased.

Figure 8:
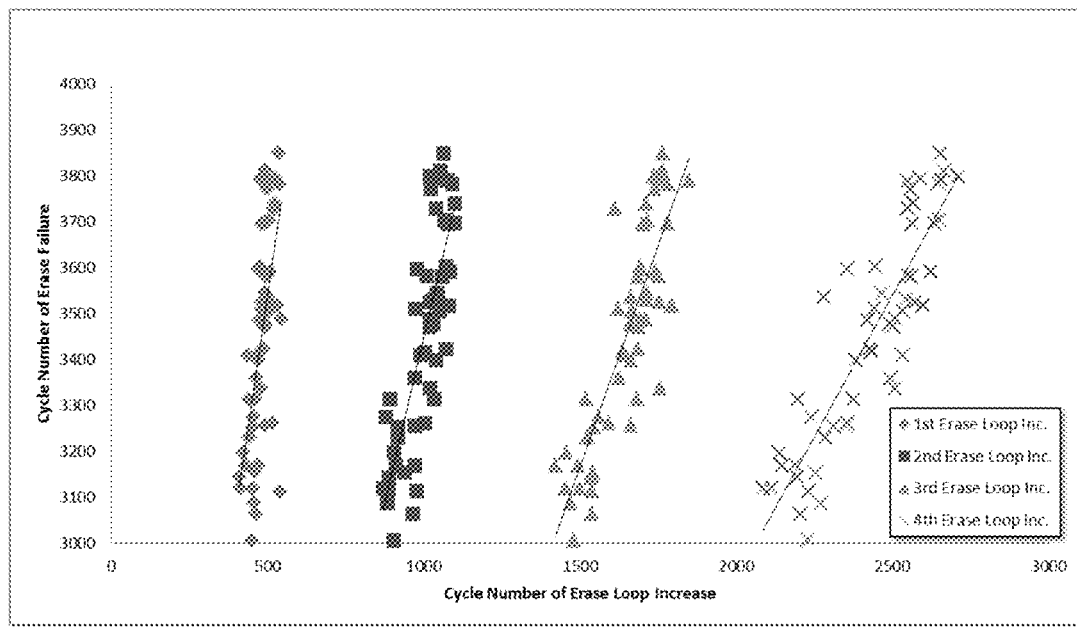
FIG. 8 illustrates an erase failure cycle versus cycle number of erase loop count increase chart.
Figure 9:
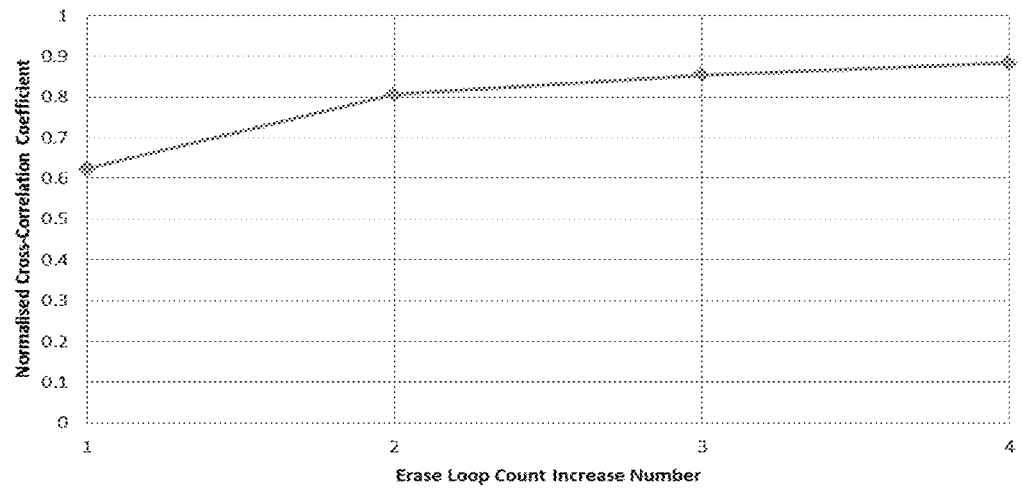
FIG. 9 illustrates a sample cross-correlation between erase failure cycle and the cycle number of erase count loop increase.

Referring to FIG. 8, a hypothetical erase failure cycle versus cycle number of erase loop count increase chart is shown. FIG. 8 illustrates a possible distribution of block cycle number failure around each of four different erase loop increments and how it is expected that at later erase loop transition points the spread of cycle numbers for the transition will widen. FIG. 9 illustrates how the cycle count at which a storage device fails to erase in the hypothetical example of FIG. 8 may be highly correlated to the cycle count at which an erase time (e.g. the number of erase loops) increases. More specifically, blocks which failed first tend to be correlated to those blocks which showed an initial discrete erase time increase first. These blocks that show an increase in discrete erase times earliest appear to have a higher rate of change in erase time with respect to cycle count.

In order to take advantage of this general correlation between ultimate block lifetime and the time at which a block first increases the number of erase loops necessary to complete an erase, the storage device is configured to keep track of the erase cycle count for the first time each block takes an additional loop count to erase. Once all, or a sufficient number of, blocks in the storage device have cycled to where they are each needing an additional erase loop, the system average of the cycle count at which this transition occurred can be determined. Additionally, for every block in the system, the actual cycle count at which the additional erase loop occurred may be compared to the calculated average for the memory device. For any particular block the lower the cycle count that it transitioned to needing an extra erase loop will lower the erase cycle capability that block has. Conversely, the higher the cycle count that a block had when this transition occurred, the higher the erase cycle capability it has. The lower and higher erase cycle capability is based on comparison to the above-noted average. The magnitude of this difference from the average can then be used to obtain a list of erase cycle capability for all blocks, relative to each other in a storage device.

Figure 10:
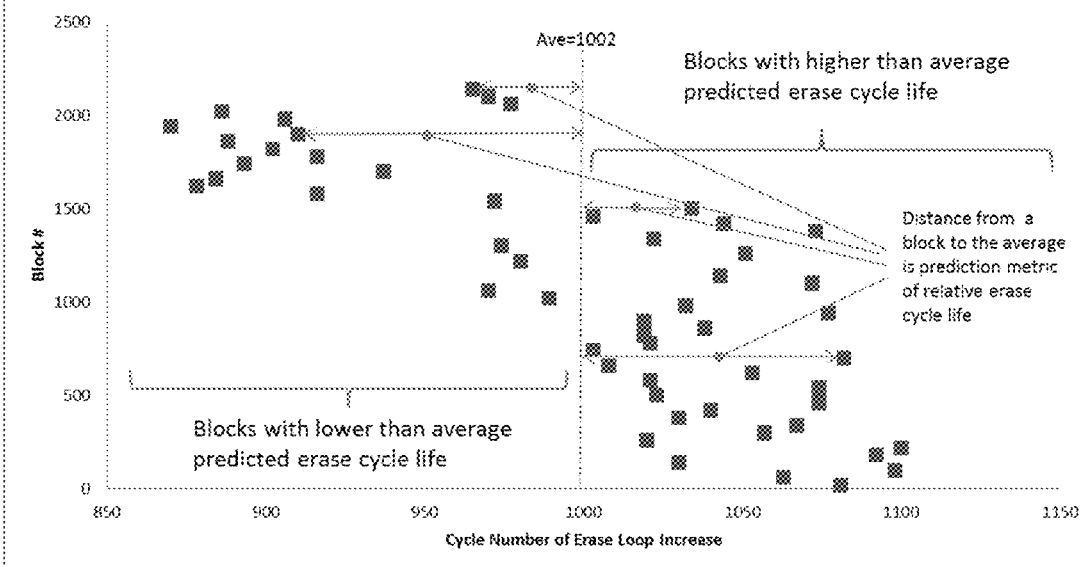
FIG. 10 illustrates an example of a possible distribution of cycle numbers at which different blocks in non-volatile memory may transition to a particular erase loop increase.

As an example of how this correlation may be measured as an erase life prediction metric, FIG. 10 illustrates the graphical representation of an erase life prediction metric for a hypothetical storage device. The illustration in FIG. 10 shows a hypothetical spread of the cycle number, for a given erase loop count increase, for each particular block number in the plurality of blocks of a non-volatile storage device. Assuming that the erase loop increase time is for a same transition for all of the blocks (e.g., the first cycle at which each particular block transitioned from two erase loops to three erase loops in the example of FIG. 10), the average transition point for this particular example would be approximately 1,002 program/erase cycles. Blocks falling below the average would then be predicted to have a lower erase life cycle compared to blocks above the average which would then be predicted to have a higher erase cycle life. The magnitude of a distance of a particular block from the average may be the metric used to rank the blocks for relative predicted erase cycle life.

Figure 11:
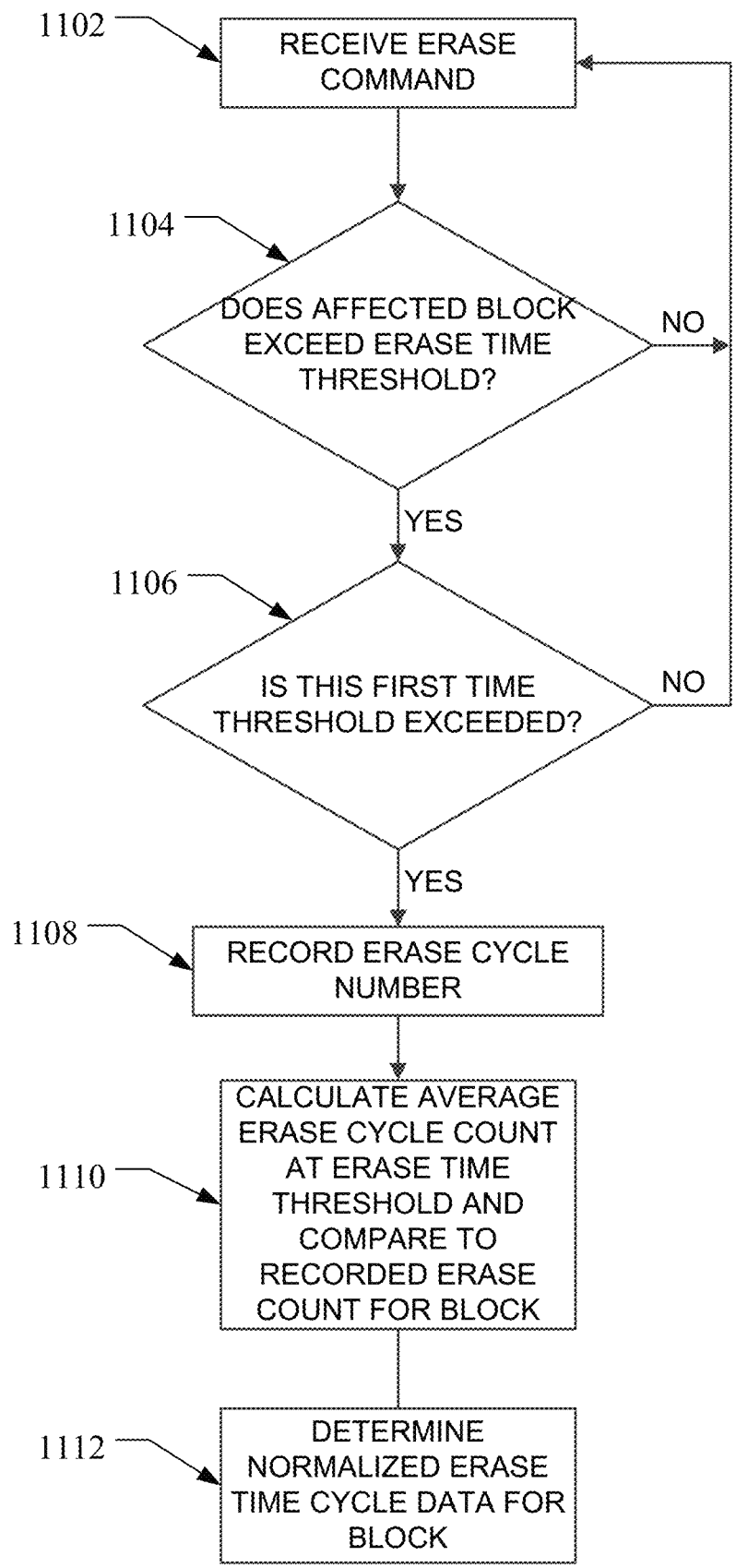
FIG. 11 is a flow diagram illustrating an embodiment of a method of gathering erase count information at the time of first exceeding an erase time threshold.

An example of a process executed by the controller of the storage device to carry out this erase life prediction calculation is illustrated in FIG. 11. Upon receiving an erase command for a block, the controller processor will look at how long the erase command takes to execute for that block (at 1102). If the execution of the erase command for that block exceeds any particular erase time threshold, then the processor determines if this is the first erase cycle in which the particular erase time has been exceeded for that block (at 1104, 1106). If it is the first time that the block has exceeded a particular erase time threshold, then the erase cycle number is recorded (at 1108). If not, and a particular threshold was already exceeded (e.g. where the cycle number for the first time it was exceeded is already stored in the block) then the controller continues on with the erase cycle without taking any special action regarding that erase cycle.

The erase cycle count identified as the first erase cycle for which the erase time increased past the particular threshold may then be averaged with the cycle number of the corresponding erase time threshold number for all other blocks in the storage device that have achieved that erase time threshold (at 1110). In one embodiment, the average may be calculated only after all of the blocks have reached the particular erase time threshold, while in other embodiments the average may be calculated when a predetermined number of the blocks in the non-volatile memory have exceeded the particular erase time threshold. In the embodiment where the average is calculated after a predetermined number have reached their respective erase time threshold, the predetermined number of blocks may be set to be a statistically significant number of blocks in the non-volatile memory such that the any change in the average would be low when all the blocks have transitioned past the particular erase time threshold.

In yet other embodiments, rather than waiting to gather sufficient erase time threshold transition data to average and then compare to individual blocks, a predetermined average erase cycle for each erase time threshold transition preprogrammed into the storage device may be used instead of averaged real measurements. The predetermined average may be an average erase cycle transition determined from prior manufacturing tests or estimates on the particular type of storage device or die and stored in the storage device 302, 402 at manufacture. Thus in this alternative embodiment, step 1110 may be modified to simply retrieving the predetermined average, or steps 1108-1112 may be combined into a single step of calculating an offset from the predetermined average erase cycle at which the particular block first exceeded the particular erase time threshold.

Subsequent to determining the average cycle number at which the erase time threshold (e.g. erase loop transition) has occurred for all of the other blocks, or using a predetermined average in other embodiments, that average is compared to the specific erase count number for the block having just reached that transition and a normalized offset from the average is stored until the controller of the storage device needs to refer to that information (at 1112). In one implementation, the information on the erase time threshold transition for the block may be stored in the block itself. In another implementation, the information on block transitions may be stored centrally in a table, such as the block status table 336, 436 that typically stores the hot count (total number of erase cycles), for blocks in the non-volatile memory 320, 420.

The transition information for each subsequent erase time threshold detected (e.g. each increase in the number of erase loops needed to complete an erase) may be separately stored in the block or in the block status table 336, 436 in addition to any earlier transition cycles for already recorded. Thus, if the maximum number of erase loops a storage device is configured to try when executing an erase command, before declaring a block a bad block, was six erase loops, then there may be six storage slots reserved for that particular block for storing the respective erase count at which each erase loop transition is detected, or the normalized offset from the average erase count at each transition.

In one implementation, the controller may only store erase count information for the most recent erase time transition (e.g. erase loop transition), rather than information on the first cycle count for each of transition, such that the prior erase count of the prior erase time transition is replaced by the most recent transition erase count (or a prior normalized erase count may be replaced with the most recent normalized erase count representing an erase time transition). In an alternative implementation of this single erase count storage per block, an erase count of the subsequent erase time transition may be normalized and averaged with prior normalized erase count information and then the averaged information stored back in the block in place of the prior information. The erase time threshold information may be provided by each die directly to the memory controller in terms of a number of erase loops, or a flag when a number of erase loops increase, or may be deduced by the memory controller based on the behavior of the blocks in a memory die.

With respect to normalization of an erase count for a particular erase time threshold (e.g., erase loop transition), the normalization calculated may be by any of a number of known normalization techniques. Consider, for example, a storage device having a single die with a thousand blocks. If the block in that die to transition earliest to a second erase loop transitioned at 450 erase cycles and the last of the blocks to transition to a second erase loop transitioned at 550 cycles, the average of the highest and lowest erase cycle counts for that particular erase time transition would be 500 and the normalized value assigned to each block would be from −50 to +50. This normalized offset number for the particular block may be stored on its own or averaged with one or more other offsets calculated for the same block at other erase time thresholds. Any of a number of known statistical analyses and normalization techniques may be used to quantify the erase time threshold data for each block relative to the others.

Figure 14:
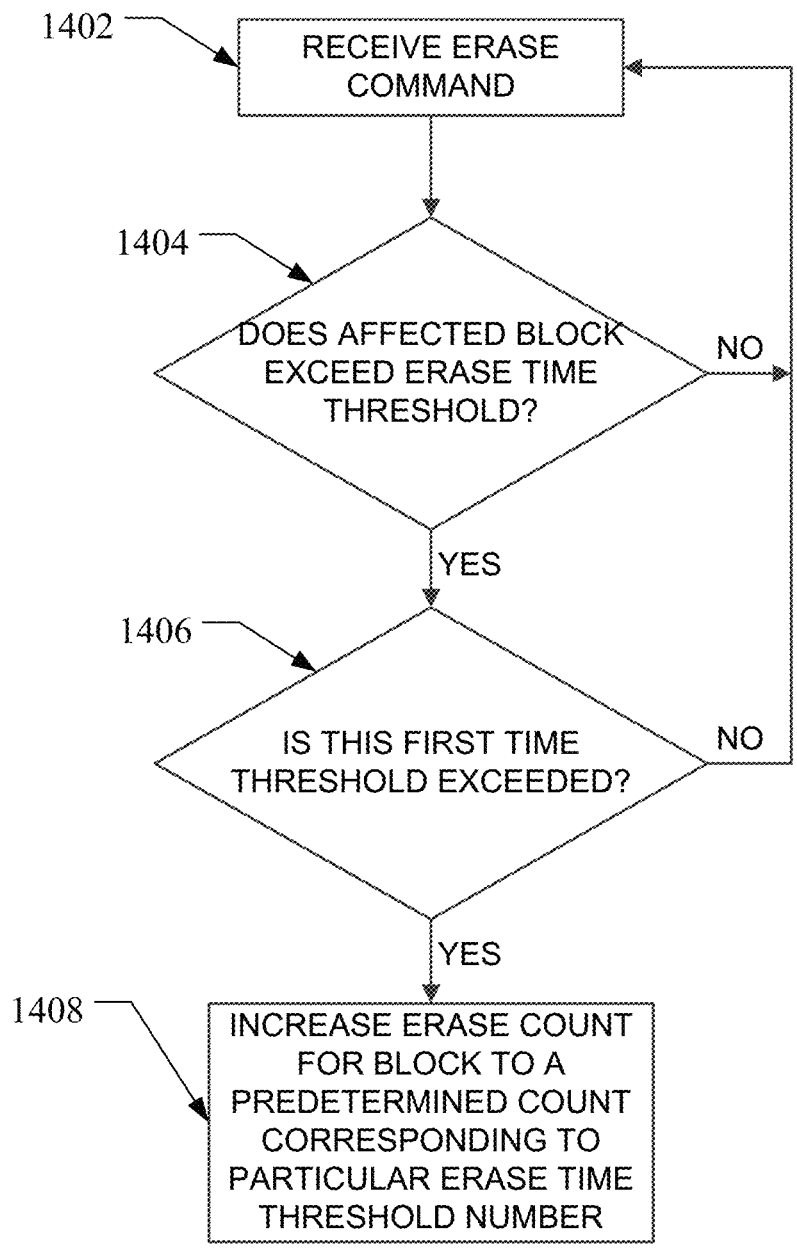
FIG. 14 is a flow diagram illustrating an alternative embodiment of the method of FIG. 11 where erase count information is adjusted at the time of first exceeding an erase time threshold.

In an alternative embodiment of the process of tracking and logging erase time transition data, and then averaging erase time transition data for blocks in a die or a device to achieve a relative offset, the erase time transition information may be used to adjust the erase count data of blocks. In this alternative embodiment, the erase time transition information need not be stored separately, but can be merged with the erase count itself such that the total hot count for each block is adjusted. Referring to FIG. 14, a flow chart describing this process is provided. Upon receiving an erase command for a block, the controller processor will look at how long the erase command takes to execute for that block (at 1402). If the execution of the erase command for that block exceeds any particular erase time threshold, then the processor determines if this is the first erase cycle in which the particular erase time has been exceeded for that block (at 1404, 1406). If it is the first time that the block has exceeded a particular erase time threshold, then the erase cycle number is increased to a predetermined count that corresponds to the particular erase time threshold number that has been reached. In other words, for each erase time increment (e.g. erase loop count, elapsed time, etc.) the controller may overwrite the actual erase count for the block with a predetermined higher erase count number. Each block, as it reaches the particular erase time threshold, has its erase count number set to the same predetermined number.

The predetermined higher erase count number will be high enough such that the weaker blocks, those have least predicted remaining life based on the erase time transition happening first, will have a higher hot count (erase count) first and thus be passed over for selection from the free block list or as a garbage collection block based on an erase count comparison technique described in greater detail below. The predetermined higher erase count number substituted for each block's actual erase count, at each of the different erase time thresholds (e.g. each transition a block makes to an additional erase loop to complete an erase) may be pre-programmed into the storage device based on the particular device characteristics. For example, referring to the hypothetical erase loop transitions and distribution of FIG. 8, if a storage device was generally expected to follow the distributions illustrated, then a possible first predetermined erase count for blocks reaching the first erase loop increment could be a count of 700, the next predetermined erase count substituted for each block reaching the next erase loop increment maybe 1300, and so on. Preferably the predetermined erase count would be selected such that it is higher than the erase count of the last block reaching the particular erase time transition.

The alternative embodiment of FIG. 14, where erase counts of blocks reaching an erase time threshold are each adjusted to a same predetermined higher erase count for the particular erase time threshold number, does not require storing erase time transition information separately. The erase time information is used to reset the erase count such that wear leveling may be accomplished in an otherwise standard manner using the now "normalized" erase counts to select hot and cold blocks. The process of adjusting the erase counts at the points of erase time transitions (thresholds) inherently includes the adjustment for predicted life based on erase time thresholds. Although the embodiment of FIG. 14 may avoid the need for separately storing and averaging block erase time transitions as described in the embodiment of FIG. 11, the embodiment of FIG. 14 may be a coarser erase life prediction method and adjustment tool than the embodiment of FIG. 11.

The storage device embodiments of FIG. 3 or FIG. 4 may be utilized to implement the processes described. Other storage device configurations are contemplated as well. In a storage device 302 such as shown in FIG. 3, the process of detecting erase time thresholds and storing an indicator or other information on the erase cycle count of each erase time transition for each block may be managed by the controller 306. Alternatively, the tasks of monitoring erase counts for the first time each threshold erase time is exceeded in a block may be delegated to secondary controllers or processors 440 in each die 418 for the respective blocks in that die 418, while other tasks of determining a predicted erase cycle life from the relative erase time transition data for all the blocks may be handled by the primary controller 306. For example, the memory controller or processor 440 on each die 418 may determine an erase time for particular blocks based on erase loop counts or an elapsed time. The elapsed time may be, for example, the time from transmission of an erase command and the time it takes for a busy/ready signal for the die, indicating when the die/blocks are ready for another command, to return to a ready state. In either implementation, the controller 306 may then apply the relative predicted erase cycle life data determined from the one or more erase time transitions for each block to improve storage device life.

Figure 12:
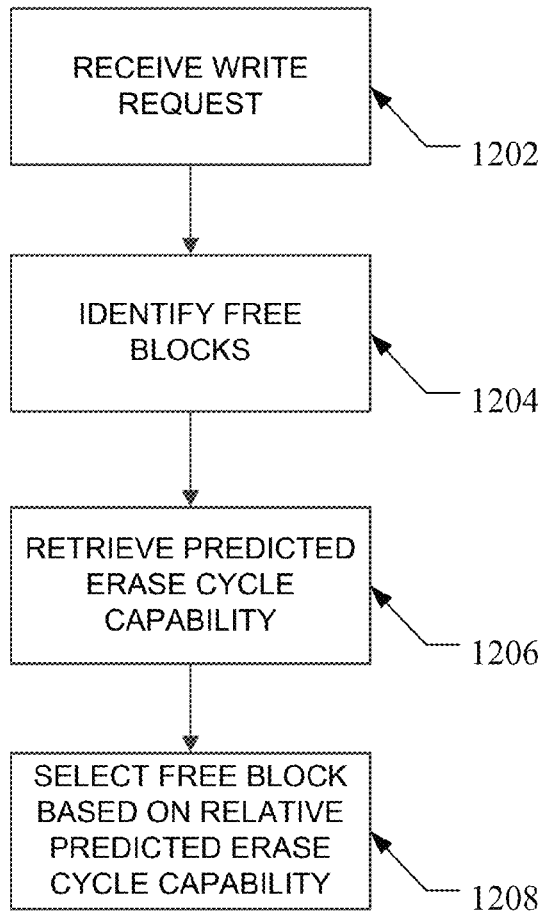
FIG. 12 is a flow diagram for a method of selecting free blocks using the predicted erase cycle capability based on relative erase counts at erase loop increases.

Using the predicted remaining relative erase cycle time for each block that the observed and recorded erase cycle at erase time transition can provide as described above with respect to the embodiment of FIG. 11, the storage device 302, 402 may then adjust how it manages block usage to optimize storage life. Examples of standard management tasks that may be optimized with this information include selection of free blocks or of garbage collection blocks. A typical NAND storage device needs new, unwritten/erased blocks for writing new data, or for consolidating data from other previously written blocks into a new block. The storage device 302, 402 may keep a free block list 334, 434 of all currently erased blocks and select one of these blocks each time a new block is necessary for a write or consolidation operation. As illustrated in FIG. 12, instead of performing a typical automatic erase count total comparison and selecting a block from the free block list that has the lowest erase count number, in one implementation, the cycle life prediction data discussed above may be used to instead provide the criteria for which a particular block is selected. When a controller receives a request to write new data and needs to select a new physical block (at 1202), the controller will identify the free blocks available and retrieve the predicted erase cycle capability data stored in each of these free blocks (at 1204, 1206). The controller may then select a block from the free block list 334, 434 having a greatest relative erase cycle capability (e.g., the highest normalized erase count transition point for a particular erase time threshold) calculated from the currently available data for blocks in the storage device 302, 402 as described above (at 1208).

Figure 13:
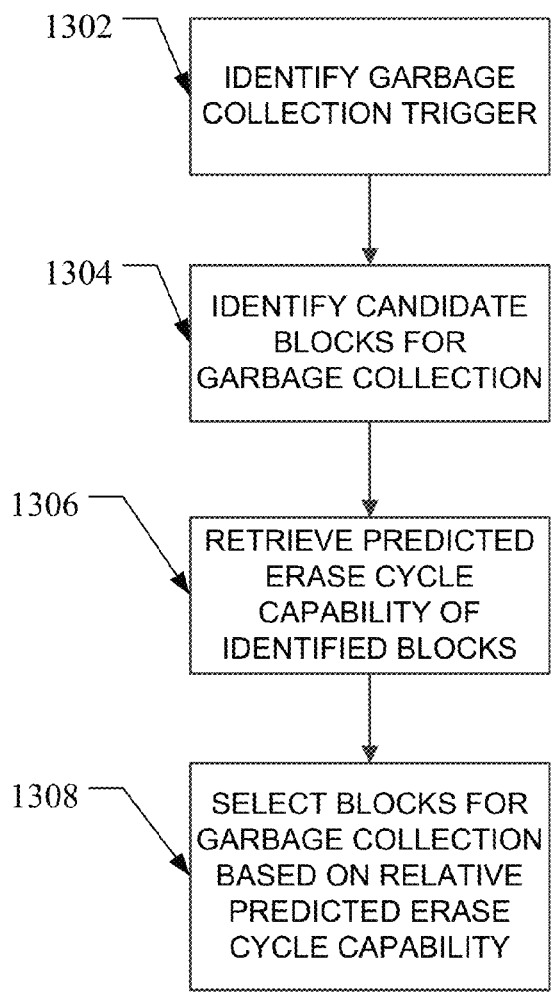
FIG. 13 is a flow diagram for a method of garbage collection block selection using the predicted erase cycle capability based on relative erase counts at erase loop increases.

Similarly, a decision as to which previously written block, having obsolete and valid data, to select for garbage collection may be based on this same erase cycle life capability data rather than a static total erase count level for each of the blocks. Garbage collection generally describes the process of creating new free blocks from previously programmed blocks that have both obsolete data and valid data. In one type of garbage collection, a free block may be selected in which to copy the valid data from multiple previously programmed blocks so that the previously programmed blocks may then be erased to create new free blocks. As illustrated in FIG. 13, a garbage collection decision process may use the data on erase counts at erase time threshold transitions as a factor in selecting blocks for garbage collection. Upon detecting the garbage collection trigger, the controller may identify previously written blocks that are eligible for garbage collection (at 1302, 1304). The garbage collection trigger may be any of a number of triggers such as the number of free blocks in a free block list 334, 434 falling below a certain percentage of the total blocks in the device, or below a fixed number of blocks. The criteria for eligibility for garbage collection may be only those previously written blocks having at least a predetermined minimal amount of obsolete data. Any of a number of garbage collection triggers or block eligibility criteria are contemplated. One typical technique for selecting blocks for garbage collection may include selecting the blocks with the least amount of valid data so that smaller amounts of data need to be transferred.

In one embodiment, the controller may retrieve the erase cycle capability of any blocks identified by the controller as eligible candidates for garbage collection, and then select blocks from the eligible blocks based at least in part on the relative predicted erase cycle capability that has been calculated as discussed above (at 1306, 1308). In one implementation, the controller may select, from eligible blocks having at least a threshold amount of obsolete data, the blocks having the highest calculated relative erase cycle life based on the erase cycle at erase time transition data for each of those blocks. Alternatively, the controller may apply a weighted formula weighting partly the amount of obsolete data in those blocks, and partly the erase cycle capability information. For example, one weighted formula for incorporating erase cycle life into block selection for garbage collection may be to score blocks for selection based on both the percentage of obsolete data and the normalized erase life according to the relation: Selection Score=(percentage obsolete data)+C*(normalized erase life), where the percentage obsolete data is a number from 0 to 100, the constant C is 0.1 and the normalized erase life for the block may be on a scale from −100 to +100. In different embodiments, the constant C may be adjusted for each erase time threshold. The above formula is provided by way of example only and other formulas for including the effect of the predicted erase cycle life of each block in a block selection process are contemplated.

By incorporating a factor for erase cycle life, it is possible that a block with a lower amount of obsolete data may be selected over a block with more obsolete data based on the influence of the erase cycle capability. A storage device 302, 402 may use the free block selection process described above, the garbage collection block selection process described above, or both processes. When both the garbage collection block selection and free block selection processes incorporate the predicted erase cycle life factor such as described above, the trend toward achieving an optimized storage device life may be accelerated. The garbage collected blocks that are selected based on the added factor of predicted erase cycle life become free blocks after the garbage collection procedure is complete and are then influenced further by the process of selecting those free blocks for use based on the predicted block erase cycle life and that selection cycle may repeat over time.

Figure 15:
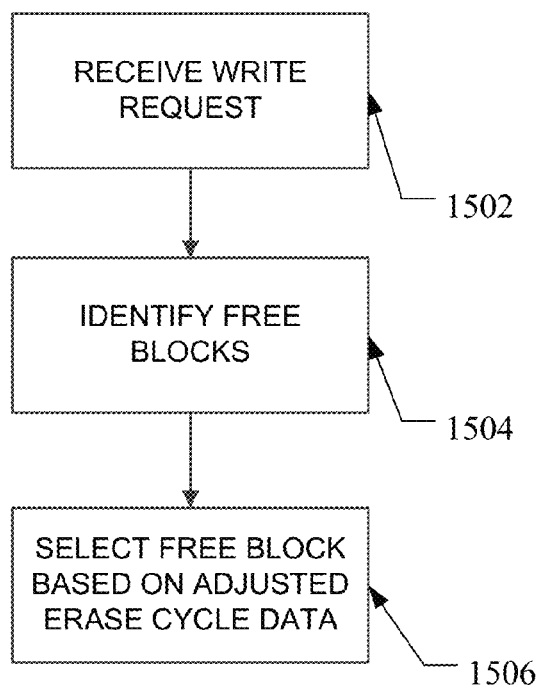
FIG. 15 is a flow diagram of an alternative embodiment of FIG. 12 for a method of selecting free blocks using the predicted erase cycle capability based on erase loop increases.

In an alternative embodiment, the method of adjusting block management, such as free block selection and selection of blocks for garbage collection, may utilize the predicted remaining erase cycle time for each block utilizing the adjusted erase count embodiment of FIG. 14. Referring to FIG. 15, a free block selection process with erase life prediction incorporated into erase counts shifted based on erase time transitions as discussed in FIG. 14 is described. The storage device 302, 402 may keep a free block list 334, 434 of all currently erased blocks and select one of these blocks each time a new block is necessary for a write or consolidation operation using a typical automatic erase count total comparison. The process of selecting a free block from the free block list may simply then be selecting the block with the lowest adjusted erase count number. Thus, when a controller receives a request to write new data and needs to select a new physical block (at 1502), the controller will identify the free blocks available (at 1504). Instead of retrieving separately stored information on a predicted erase cycle capability as described in FIG. 12, the controller selects a block from the free block list 334, 434 having a lowest adjusted (normalized) erase count (at 1506). Because the erase counts of the weakest (earlier erase time transition) blocks should be adjusted to a predetermined higher erase count first, the stronger blocks are more likely to be selected from the free block list.

Figure 16:
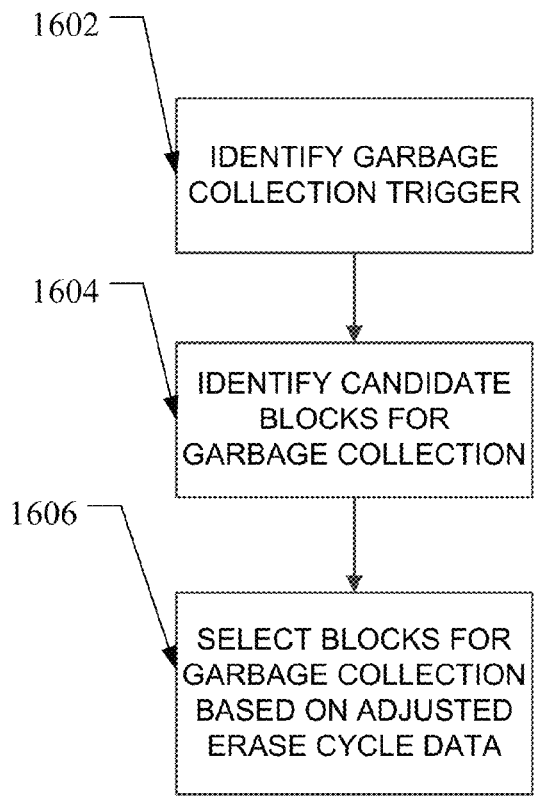
FIG. 16 is a flow diagram of an alternative embodiment of FIG. 13 for a method of garbage collection block selection using the predicted erase cycle capability based on erase counts at erase loop increases.

Similarly, a decision as to which previously written block, having obsolete and valid data, to select for garbage collection may be based on using this same adjusted erase count for embodiments such as FIG. 14 that utilize the erase time threshold to adjust erase counts. As illustrated in FIG. 16, a garbage collection decision process may use the adjusted erase counts in selecting blocks for garbage collection. Upon detecting the garbage collection trigger, the controller may identify previously written blocks that are eligible for garbage collection (at 1602, 1604). The garbage collection trigger may be any of a number of triggers such as the number of free blocks in a free block list 334, 434 falling below a certain percentage of the total blocks in the device, or below a fixed number of blocks. The criteria for eligibility for garbage collection may be only those previously written blocks having at least a predetermined minimal amount of obsolete data. Any of a number of garbage collection triggers or block eligibility criteria are contemplated. As discussed above, one typical technique for selecting blocks for garbage collection may include selecting the blocks with the least amount of valid data so that smaller amounts of data need to be transferred. The adjusted erase count of the eligible blocks for garbage collection may then be used. For example, the lowest erase count block of the blocks eligible for garbage collection may be selected, or a weighting formula that takes into account relative amounts of valid data and erase count (based on the erase counts adjusted for erase time transitions as described in FIG. 14) may be used similar to that discussed with respect to the embodiment of FIG. 13 above.

In addition to the passive wear leveling discussed in the embodiments of FIGS. 12-13 and 15-16, the erase life prediction data based on monitoring when erase time thresholds are first exceeded may be used in active wear leveling. Active wear leveling may be triggered at periodic intervals and involve the controller selecting blocks (based on predicted erase life as described above) to reduce stress on those blocks. For example, weaker blocks that are currently fully programmed with hotter (more active data) may have their data copied to stronger blocks in the free block pool or stronger blocks having measurably colder data (e.g. data that has not been written or erased for a long period) may have their data copied to weaker blocks. Any of a number of known active wear leveling techniques may be modified to incorporate the erase life prediction information, whether separately stored or integrated into an adjusted erase count, based on first erase time threshold transitions as described above.

In the embodiments discussed above, the relative erase cycle life of each block is predicted through changes in erase cycle time that are tracked and recorded on a block by block basis. The changes in erase cycle time are measured in terms of the erase cycle (e.g. the specific hot count) at which each particular block first exceeds a threshold amount of time to reach an erase state. These erase time thresholds may be set in different ways, for example a specific elapsed time or a particular number of erase loops as described previously. The relative data on rate of change of erase cycle time is then processed to rank the predicted erase cycle life of each block. Generally, the earlier a block needs to transition to a longer erase time to finish an erase as compared to other blocks, the earlier that block is assumed to likely fail. That information can then be used to change how the storage device utilizes memory blocks, for example it can be used to select which free blocks or garbage collection blocks should be used. The result is a mechanism for helping to utilize the maximum life of all of the blocks in a storage device so that the life of a storage device is not limited to the life of the weakest blocks while remaining life in stronger blocks is wasted longer. Ideally, all blocks in a storage device could be used to their maximum potential by tailoring the expected life analysis to each block and adjusting the memory usage accordingly.

In additional embodiments, rather than using the prediction of block life to influence block selection for garbage collection, free block selection, and active and passive wear leveling generally, the predicted erase cycle life may instead be used adjust the erase and programming parameters of each individual block. Once a relative erase cycle life prediction is available for a block as described above, the controller may increase or decrease program and erase parameters for each block to adjust for the rate of wear. For example, for the blocks which are predicted to have a shorter life, the controller may lower the erase and/or programming damage-inducing parameters. These parameters may include the erase and/or program voltage applied to the each block, the time the erase and or program voltage is applied, or a combination of both. Conversely, those blocks which are predicted to have a longer life based on the later relative cycle count at which their erase time increases may have their erase and/or programming parameters made more aggressive such that the average performance and power of the whole system remains approximately the same.

A goal of this block-specific alteration of programming and erase parameters is to adjust the actual wearing of blocks so that the wearing will be equalized and the product life will be extended. In general, increasing the program or erase voltage may increase the wear on a block but shorten the program or erase time, while reducing the voltage may lower the wear on a block and may increase the time needed to erase. When reducing the erase voltage, the erase process may need to be lengthened to achieve a full erase, where the time to achieve full erase is a result of the change in the erase voltage. More specifically, when the erase voltage level is adjusted, the time to erase then varies accordingly. A higher erase voltage may tend to cause a block to erase more quickly and a lower erase voltage may tend to cause a block to erase more slowly.

In yet other embodiments, it is contemplated that the time a voltage is applied, for example the length of an erase loop, may be adjusted separately from, or in conjunction with, a change in the erase voltage. In either case, whether the erase time increases due to an erase voltage change or a deliberate change in the timing of applying an erase voltage, the controller may determine and store a new baseline erase time for the adjusted block so that future relative erase cycle life calculations for the block are not skewed by the change in erase voltage or erase time adjustment made for the block due to a previous erase cycle life determination.

Figure 17:
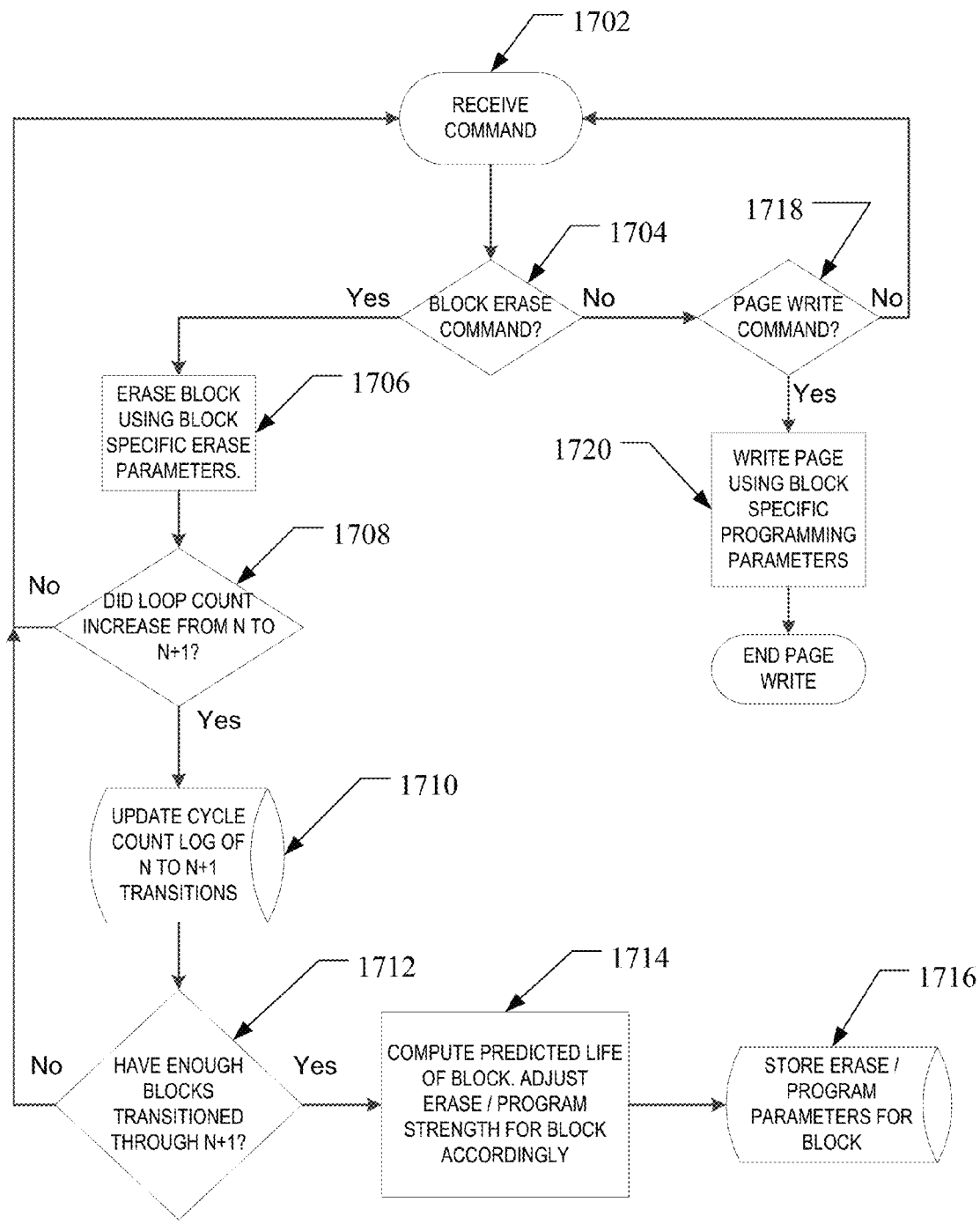
FIG. 17 is a flow diagram for a method of adjusting program/erase parameters for erase and program operations using the predicted erase cycle capability based on relative erase counts at erase loop increases.

An embodiment of a process for adjusting the program and/or erase parameters of blocks is illustrated in FIG. 17. When a command is received, and that command is a block erase, the identified block is erased using the current erase parameters for the block which may be stored in the block itself or in the central blocks status table 336, 436 maintained in non-volatile memory 320, 420 for all blocks (at 1702, 1704, 1706). While erasing the block, the controller determines if the time for the erase exceeded an erase time threshold for the first time (at 1708). The threshold may be a particular elapsed time change or a loop count number increase in different implementations. If an erase time threshold has first been exceeded during the erase operation, then the erase cycle count at which this just happened is logged for the block (at 1710). If enough of the blocks in the storage device have transitioned past a particular threshold, then the controller may use the erase cycle counts logged for the blocks to calculate an average erase cycle transition and compares the erase time transition for each block to the average to then compute a new relative expected erase cycle life for the block (e.g. a normalized value indicating a relative offset from the average as discussed previously. This information may then be used by the controller to adjust one or more program and/or erase parameters for each block accordingly, where the new program and/or erase parameter is then stored for use the next time an erase or programming command comes in for each particular block (at 1712, 1714, 1716).

If enough of the blocks have not reached a particular erase time transition, then the controller continues to update the transition cycle log until the predetermined critical number of blocks has reached the transition point and the relative life expectancy may be calculated for each block. The number of blocks necessary to reach the erase time transition may be all or a statistically significant number of the blocks as discussed previously. Alternatively, as discussed above, a predetermined average erase cycle stored at manufacture in the storage device 302, 402 may be used for each erase time threshold transition rather than taking actual measurements, accumulating sufficient actual measurements and averaging them. The relative offset from the predetermined average erase cycle of a block for each respective erase time transition may then be used to adjust the magnitude of any change made to the program and/or erase parameters of the block.

An adjustment to the program and/or erase parameters based on the recorded erase time transition count may also be made for programming operations based on the relative erase cycle life determination for the block. Although an erase operation is typically considered to present greater stress and wear on a block, programming operations on the block may also contribute to the wear on a block. The determined relative erase cycle life information may also be used to make adjustments to increase or decrease the program voltage and program time parameters for each block. Referring again to FIG. 17, when the received command is a page write command for a particular page in a particular block, the stored program parameters for the block are retrieved from the block status table 336, 436 and the page is written using the block specific programming parameters (at 1718, 1720).

The adjustment to one or more erase and/or program parameters may be proportional to the normalized relative erase life cycle data. In order to adjust erase or program parameters, the controller may use the erase cycle life information to store a new erase and/or program voltages, or voltage adjustment factors (or other program and/or erase parameters such as time duration), in the block status table 336, 436. The controller may then, at the time of an erase or a program operation, overwrite or override the preset erase and/or program parameter for each block with the adjusted parameter. This may be accomplished in any of a number of ways depending on the manufacturer specific mechanisms for accessing the block program and erase parameters. For example, some NAND flash memories may include a test mode that, when accessed, allow for adjustment of the default program and/or erase parameters set at the manufacturer for each block. The adjustment made to the particular parameter (e.g. erase voltage) for a particular block may be proportional to the normalized erase time threshold differences identified previously, where weaker cells likely to fail first have their erase voltage lowered while stronger cells have their erase voltages raised.

The increase or decrease in the voltage applied for a program or erase may be proportional to an amount the predicted erase cycle life indicator (e.g. normalized erase count at the time an erase time threshold is first exceeded) is above or below an average for all the blocks. The increase or decrease may be a continuous function of variation from the average, or may be broken into discrete voltage increments. Also, the block program voltage used to program each block may be adjusted in the same amount, or a different amount, than the erase voltage. In one embodiment, only the erase voltage for a particular block may be adjusted and the program voltage for the block remains unchanged. In other embodiments, only the program voltage may be changed for each block, or both the program and erase voltages may be changed for each block.

In one embodiment, program and/or erase parameter adjustments may be implemented without making any changes to an existing block usage process, such as free block selection or garbage collection block selection. Instead, an existing block selection process may be used, without using the erase time transition analysis, with respect to the block selection process, just with respect to the program and/or erase parameter applied to the selected block. An advantage of using the erase cycle time increase metric for program and/or erase parameter adjustment is that the individualized adjustment of parameters for each block may proactively change the life of each block (using erase and/or programming parameter changes to increase wear on those with higher predicted erase life and decrease wear on those with lower predicted erase life) such that the blocks in the storage device may tend to fail at the same time. Ideally, adjusting the program and/or erase parameters may help equalize the hot count at which blocks transition to the final (failing) state. Although both embodiments for adjusting block selection processes and adjusting block program and/or erase cycles may provide for improved storage device life, another potential advantage of adjusting individual program and/or erase parameters over adjusting a block selection process is the ability to adjust individual block life even when blocks are managed in metablock groupings by the controller. For example, in certain storage devices a metablock is the unit of operation and a controller may select free blocks or blocks to garbage collect on a metablock scale. In those situations, the weakest block in the metablock will dictate metablock selection based on predicted block erase life as described above. In contrast, the program and erase parameters may be applied on an individual block basis even though those blocks may be part of a larger metablock management process.

A system and method has been disclosed for using information on the erase cycle at which each block first transitions to a longer erase time to predict a relative erase cycle life of each block in a non-volatile memory. The data gathered on the first erase cycle at which each of one or more erase time thresholds is exceeded may provide more accurate predictions of when a block will fail, and therefore a guide by which block management may be improved. The erase cycle life prediction information may be stored in each block and may be used to adjust block selections and/or block program/erase parameters to increase storage device life as compared to techniques that simply try and cycle all blocks an equal number of times.

The methods described herein may be embodied in instructions on computer readable media. "Computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a processor, memory device, computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

It is therefore intended that the foregoing detailed description be regarded as illustrative rather than limiting, and that it be understood that it is the following claims, including all equivalents, that are intended to define the spirit and scope of this invention.

I claim:

1. An apparatus comprising:
a plurality of blocks of non-volatile memory cells, each of the plurality of blocks comprising a plurality of the non-volatile memory cells; and
a controller in communication with the plurality of blocks, wherein the controller is configured to:
monitor a time duration for erasing one or more of the plurality of blocks;
identify a time, for each of the one or more of the plurality of blocks, when the time duration exceeds a predetermined threshold; and
store an indicator for each of the one or more of the plurality of blocks identified as exceeding the predetermined threshold.

2. The apparatus of claim 1, wherein the controller is configured to monitor the time duration based on a number of erase loops executed on each block, wherein an erase loop comprises a process of applying an erase voltage and determining an erase state after applying the erase voltage.

3. The apparatus of claim 2, wherein the predetermined threshold comprises a predetermined number of erase loops.

4. The apparatus of claim 1, wherein the controller is configured to monitor the time duration by tracking a time elapsed between sending an erase command for a block and receiving a change in a busy/ready signal from the block indicating that the block is ready for another command.

5. The apparatus of claim 1, wherein the indicator comprises information on a particular erase cycle at which the time duration for a respective block of the one or more of the plurality of blocks identified as exceeding the predetermined threshold first exceeded the predetermined threshold.

6. The apparatus of claim 5, wherein the predetermined threshold comprises a plurality of thresholds, the plurality of thresholds representing different erase time durations, and wherein the controller is configured to store, for each respective block of the one or more of the plurality of blocks identified as exceeding the predetermined threshold, an indicator representative of an erase cycle at which each threshold is first exceeded for the respective block.

7. The apparatus of claim 5, wherein the controller is configured to select a free block from a plurality of free blocks in a free block list for use as a new write block, each free block comprising a previously erased block in the apparatus, based at least in part on the indicator for each block in the free block list, wherein the controller is configured to select the free block having the indicator indicating a highest erase cycle at which the time duration first exceeded the predetermined threshold.

8. The apparatus of claim 5, wherein the controller is configured to select for a garbage collection operation a previously fully programmed one of the plurality of blocks based at least in part on the indicator for each of the fully programmed blocks, wherein the controller is configured to select for the garbage collection operation the previously fully programmed one of the plurality of blocks having the indicator indicating a highest erase cycle at which the time duration first exceeded the predetermined threshold.

9. The apparatus of claim 8, wherein the controller is further configured to select for the garbage collection operation the previously fully programmed one of the plurality of blocks based both on a total amount of obsolete data in the previously programmed blocks and the indicator in the previously programmed blocks indicating a highest erase cycle at which the time duration first exceeded the predetermined threshold.

10. A non-volatile memory device comprising:
a plurality of memory die, each comprising a plurality of blocks of non-volatile memory cells;
a plurality of controllers each associated with a respective one of the plurality of memory die;
wherein each controller is configured to, for each of the plurality of blocks associated with its respective memory die:
monitor an erase time for a block of an associated memory die;
identify when the erase time for the block exceeds a predetermined threshold; and
store an indicator for each block having an erase time that exceeds the predetermined threshold to erase.

11. The non-volatile memory device of claim 10, wherein each controller is configured to select a free block from a plurality of free blocks in a free block list for use as a new write block, each free block comprising a previously erased block in the non-volatile memory device, based at least in part the indicator for each block in the free block list, wherein each controller is configured to select a free block having the indicator indicating a highest erase cycle at which the erase time first exceeded the predetermined threshold.

12. The non-volatile memory device of claim 10, wherein each controller is configured to select for a garbage collection operation a previously programmed one of the plurality of blocks having valid and obsolete data based at least in part on the indicator for each of the fully programmed blocks, wherein each controller is configured to select for garbage collection the previously programmed block having the indicator indicating a highest erase cycle at which the erase time first exceeded the predetermined threshold.

13. The non-volatile memory device of claim 12, wherein each controller is further configured to select for the garbage collection the previously programmed one of the plurality of blocks based both on a total number of obsolete data in the previously programmed blocks and the indicator in the previously programmed blocks.

14. A method for monitoring an erase life of blocks in a non-volatile memory comprising:
    in a non-volatile memory device comprising a plurality of blocks of non-volatile memory cells, each of the plurality of blocks comprising a plurality of the non-volatile memory cells, and a controller in communication with the plurality of blocks, the controller:
        monitoring a time duration necessary to erase one or more of the plurality of blocks;
        identifying a time, for each of the one or more of the plurality of blocks, when the time duration exceeds a predetermined threshold; and
        storing for each respective one of the one or more of the plurality of blocks an indicator identifying a relative expected erase life for the respective block compared to other of the plurality of blocks based on the identified time when the time duration exceeded the predetermined threshold.

15. The method of claim 14, further comprising the controller monitoring the time duration based on a number of erase loops executed on each block before a block is fully erased, wherein each erase loop comprises a process of applying an erase voltage and determining an erase state after applying the erase voltage.

16. The method of claim 15, wherein the predetermined threshold comprises a predetermined number of erase loops.

17. The method of claim 14, wherein monitoring the time duration comprises the controller tracking a time elapsed between sending an erase command for a block and receiving a change in a busy/ready signal from the block.

18. The method of claim 14, wherein storing the indicator for each respective block comprises storing information relating to a particular erase cycle for the respective block at which the time duration first exceeded the predetermined threshold.

19. The method of claim 18, wherein the predetermined threshold comprises a plurality of thresholds, the plurality of thresholds representing different erase times, and wherein upon identification of each of the plurality of thresholds, the controller is configured to store an indicator representative of a first erase cycle at which a respective threshold is first reached for the respective block.

20. The method of claim 18, further comprising the controller selecting a free block from a plurality of free blocks in a free block list for use as a new write block, each free block comprising a previously erased block in the non-volatile memory device, based at least in part on the indicator for each block in the free block list, wherein the controller selects the free block having the indicator indicating a highest erase cycle at which the time duration first exceeded the predetermined threshold.

21. The method of claim 18, further comprising the controller selecting for a garbage collection operation a previously programmed one of the plurality of blocks having valid and obsolete data based at least in part on the indicator for each of the previously programmed blocks.

22. The method of claim 21, further comprising selecting for the garbage collection operation the previously programmed one of the plurality of blocks based both on a total amount of obsolete data in the previously programmed blocks and the indicator associated with each of the previously programmed blocks.

* * * * *